(12) United States Patent
McClellan et al.

(10) Patent No.: US 6,243,847 B1
(45) Date of Patent: Jun. 5, 2001

(54) PARITY INSERTION WITH PRECODER FEEDBACK IN A PRML READ CHANNEL

(75) Inventors: Brett McClellan, Laguna Hills; Michael Leung, Sunnyvale; Leo Fu, San Jose; Taehyun Jeon, Sunnyvale, all of CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/215,982

(22) Filed: Dec. 18, 1998

(51) Int. Cl.[7] ...................................................... G06F 11/10
(52) U.S. Cl. ........................ 714/800; 714/801; 714/799
(58) Field of Search ..................................... 714/800, 799, 714/801; 370/540

(56) References Cited

U.S. PATENT DOCUMENTS

| | | | |
|---|---|---|---|
| 4,926,423 | * 5/1990 | Zukowski | 370/540 |
| 5,258,838 | * 11/1993 | Citta | 348/470 |
| 5,621,761 | * 4/1997 | Heegard | 375/265 |
| 5,771,127 | 6/1998 | Reed et al. . | |

* cited by examiner

Primary Examiner—Phung M. Chung
(74) Attorney, Agent, or Firm—W. Daniel Swayze, Jr.; W. James Brady; Frederick J. Telecky, Jr.

(57) ABSTRACT

A circuit for inserting a parity signal into a data stream, including a precoder circuit to precode the data stream to be written on a medium by generating a precoded data stream; a parity circuit to generate a parity signal based on said data stream at a predetermined time; and an insertion circuit to insert said parity signal into said precoded data stream.

5 Claims, 5 Drawing Sheets

PARITY INSERTION WITH PRECODER FEEDBACK IN A PRML READ CHANNEL

FIELD OF THE INVENTION

The present invention relates generally to write precoders for use in magnetic storage disk drives and more particularly to a method and apparatus for detecting and controlling errors within a data stream through a write precoder.

BACKGROUND OF THE INVENTION

Conventional magnetic storage devices include a magnetic transducer or "head" suspended in close proximity to a recording medium, for example, a magnetic disk having a plurality of concentric tracks. The transducer is supported by an air-bearing slider mounted to a flexible suspension. The suspension in turn is attached to a positioning actuator. During normal operation, relative motion is provided between the head and the recording medium as the positioning actuator dynamically positions the head over the desired track. The information recorded on the magnetic disk is transmitted to a preamplifier which is in turn transmitted to a read channel. One example of read channels in use in todays technology is a PRML read channel.

The magnetic recording channel can be characterized as a channel with significant intersymbol interference, particularly at high recording densities. Partial response maximum likelihood (PRML) detection systems based on shaping the channel response to a suitable partial response have become a popular detection method for such channels. Partial responses such as class IV partial response (PR4) and enhanced PR4 (EPR4) are common due to their good performance on moderate density and high density channels. At higher densities, higher order polynomials such as EEPR4 have been proposed. These partial responses are of the form $(1-D)(1+D)^n$, with n determining the order of the polynomial. As n increases, the high frequency response is attenuated, hence better matching the high frequency attenuation of the magnetic recording channel at high recording densities.

As recording densities increase, the use of trellis-based coding schemes have also been proposed. These include matched spectral null coding schemes based on the matched spectral null theorem. These have been used to increase the minimum distance on the PR4 based target from $2\sqrt{2}$ to 4 and have achieved efficient implementations with practical code rates of 8/10 through the use of time varying trellises.

At higher recording densities with higher order partial responses, run length constrained codes demonstrate improved distance properties. For example, the use of an EEPR4 target with a ⅔ (1,7) code increases the minimum distance from $2\sqrt{6}$ to $2\sqrt{10}$. Codes achieving the same increase in minimum distance but without the "d=1" constraint such as maximum transition run length (MTR) codes have been proposed for the EEPR4 partial response and finite delay tree search type detectors. These run length constrained codes help simplify the target trellis by eliminating states. Even higher rate codes to achieve the same increase in minimum distance have also been proposed. These include a family of codes and the rate 8/9 code based on a time varying MTR (TMTR) constraint.

Coding to detect and eliminate certain error events on the PR4 channel was considered. The eliminated error events were the ones most likely due to noise correlation from the equalization to the PR4 response. This achieved an increase in detection SNR of ≈1.25 dB with a rate 8/9 code at recording densities around 2 bits per $PW_{50}$.

A single bit parity code is utilized to detect the presence of the identified dominant error events. This coding constraint can achieve a moderate coding gain but with a high code rate which is desirable for high density magnetic recording. For the detection of the coded data, a postprocessor is possible based on correlating the received signal to identify the likely locations of the error events. The most likely event is then corrected.

The basic recording and detection system model is shown in FIG. 5 with the channel response based on the Lorentzian step response. The channel frequency response is $$H_{chan}(f) = j\pi PW_{50} \sin(\pi f T) e^{-|\pi PW_{50} f|}$$

where $PW_{50}$ is the half amplitude pulse width and T is the recorded bit period.

The recording channel is often shaped to the required target frequency response G(f) through the use of a continuous time and discrete time filter. For the purpose of analysis, the continuous time filter is assumed to band limit the signal and equalize it to the desired response before sampling at the baud rate 1/T. The equalizer is assumed to minimize the mean square error between the equalizer output and the desired target. This requires an equalizer response of $$E(f) = \frac{S_x(f)G(f)H^*_{chan}(f)}{N(f) + |H_{chan}(f)|^2 S_x(f)}$$

where $S_x(f)$ is the power spectral density of the input data and N(f) is the noise power spectral density at the channel output. At the detector input, the signal consists of the input signal shaped to the desired partial response plus correlated noise with a power spectral density of $$N_d(f) = 1/T(S_x(f)|G(f) - H_{chan}(f)E(f)|^2 + N(f)|E(f)|^2).$$

While this includes distortion, it is considered as Gaussian noise for the purpose of analysis and the noise autocorrelation is assumed to be $$R(k) = T \int_{-1/2T}^{1/2T} N_d(f) e^{j2\pi fkT} df.$$

WIth maximum likelihood detection, the error rate performance is determined by the distance between any two allowable data sequences and the noise correlation. The probability of an error event occurring in the presence of correlated noise can be calculated as $$P(ErrorEvent) = Q\left( \frac{\sum_{k=0}^{J} \frac{e_k^2}{2}}{\sum_{k=0}^{J} e_k^2 R_n(0) + \sum_{i=0}^{J} \sum_{j=0, j\neq i}^{J} e_i e_j R_n(i-j)} \right)$$

where the error event $\{e_0, e_1, \ldots, e_j\}$ is the difference between any two possible noiseless sequences at the detector input and R(k) is the noise autocorrelation at the detector input. The corresponding error event in terms of channel input symbols will be denoted $a_k$ with $$e_k = a_k * g_k$$

where * denotes convolution and the sequence $g_k$ is the inverse D transform of the desired target response G(D).

The optimum target response is the one which whitens the noise at the detector input. While the exact response to achieve this is impractical to implement, a reasonable compromise is to shape the response to a suitable polynomial. While polynomials of the form $(1-D)(1+D)^n$ have been used, it is proposed here to use a polynomial of the form $(1-D^2)(h_0+h_1D+h_2D^2)$. The $(1-D^2)$ term provides a null at DC and at the Nyquist frequency which correspond with the DC null and high frequency attenuation in the magnetic recording channel. The $h_0+h_1D+h_2D^2$ filter allows further high frequency attenuation to be introduced to match the channel response. In order to avoid requirements for multipliers in the detector, the target response should contain simple integer ratios. In particular, the response $(1-D^2)(2+2D+D^2)$ has been determined to perform better at higher recording densities. FIG. 6 shows the magnitude of the proposed target response compared to the EPR4 and the EEPR4 target responses and the Lorentzian channel response at a density of 3.0 bits per $PW_{50}$. It can be seen that the proposed target provides additional attenuation at high frequencies and hence should be a better match to the recording channel. The event error rate performance of the proposed target (labeled 6221), the EPR4 target, and the EEPR4 target are plotted in FIG. 7. The plot shows the calculated required channel SNR for an event error rate of $10^{-6}$ based on the probability of the error events occurring and being supported. The SNR is defined here as the ratio of the peak read pulse amplitude to the square root of the channel noise power in the Nyquist band. The $(1-D^2)(2+2D+D^2)$ target performs almost 1 dB better than EEPR4 at channel densities above 3 bits per $PW_{50}$. As the response has the same order polynomial as the EEPR4 response, a maximum likelihood detector based on the Viterbi algorithm will have the same number of states in the detector. The difference between the EEPR4 response and the 6221 target is that while the EEPR4 response is symmetric, similar to the ideal channel response, the 6221 target is closer to a minimum phase representation of the channel. This allows the 6221 target to better match the magnitude response of the channel but at the expense of some phase equalization requirements.

TABLE I

RANKING OF EVENTS AT A CHANNEL DENSITY OF 3.0 BITS/$PW_{50}$

| Event ± $\alpha_k$ | SNR level (dB) |
| --- | --- |
| +2 −2 +2 | 0.00 |
| +2 −2 +2 −2 +2 | 0.80 |
| +2 −2 +2 −2 +2 −2 | 1.35 |
| +2 −2 +2 −2 +2 −2 +2 −2 +2 | 1.37 |
| +2 −2 +2 −2 +2 −2 +2 −2 +2 −2 | 1.38 |
| ... | ... |

TABLE II

RANKING OF EVENTS AT A CHANNEL DENSITY OF 3.5 BITS/$PW_{50}$

| Event ± $\alpha_k$ | SNR level (dB) |
| --- | --- |
| +2 −2 +2 | 0.00 |
| +2 −2 +2 −2 +2 | 1.36 |
| +2 −2 +2 −2 +2 −2 | 1.73 |
| +2 −2 +2 0 0 +2 −2 +2 | 1.74 |
| +2 −2 +2 −2 +2 −2 +2 −2 +2 | 1.89 |
| ... | ... |

The error rate performance of the system depends on the likelihood of error events occurring and the noise correlation. As the recording density increases, the optimum target response changes and the likelihood of particular error events change relative to each other. Using the system model to calculate the noise autocorrelation and enumerating the possible error events, the relative likelihood of possible error events can be ranked. Tables I and 11 list the most likely error events for the $(1-D^2)(2+2D+D^2)$ target, taking into account noise correlation for channel recording densities of 3.0 and 3.5 bits per $PW_{50}$. The tables are based on a calculated error rate of $1\times10^{-6}$, and the likelihoods are expressed in terms of effective SNR above the most likely event. It can be seen that the events $a_k=\{+2,-2,+2\}$ and $a_k=\{+2,-2,+2,-2,+2\}$ are the most likely at these densities. If the effect of these two events can be eliminated through coding, then a coding gain can be achieved. FIG. 8 shows the calculated performance of the $(1-D^2)(2+2D+D^2)$ target with the two most likely error events eliminated, the EEPR4 target performance with all the events with squared distance less than 40 eliminated and the EPR4 detector performance for reference. The $(1-D^2)(2+2D+D^2)$ target performs well with both coded schemes performing ≈3 dB better than EPR4 at a density of 3.5 bits per $PW_{50}$. Thus, the combination of the modified target and elimination of the two most likely error events should result in a considerable performance improvement.

As the dominant error events are $a_k=\{+2,-2,+2\}$ and $a_k=\{+2,-2,+2,-2,+2\}$, a code to detect the occurrence of these error events is required. It can readily be seen that a single bit parity check block code can be used to detect these error events. Consider a parity code of length N. Whenever one of the error events occurs within a code word, three or five bits are inverted causing a parity violation. If the error event spans the boundary of two code words, then there will be an odd number of inverted bits in one of the code words causing its parity check to be violated. Hence, the use of a single bit parity code allows the dominant error events on the high density recording channel to be detected when equalized to the proposed target response. The decoder can then pick the most likely data pattern which does not violate the parity constraint.

While an event length parity code with odd parity can provide some run length constraints with a rate (N−1)/N, stricter constraints may be required to ensure sufficient timing and gain recovery information. An interleaved run length constraint is also required to ensure Viterbi path merging on a target with a Nyquist and DC null.

The recorded data may be allowed to contain sequences that support the dominant error events, but that coding is employed to detect when a single such error event occurs and allow soft decision correction of it. This is in contrast to coding schemes proposed for the EEPR4 channel such as the $\frac{2}{3}$ (1,7) code and MTR coding. These codes achieve coding gain by preventing any pattern that supports a minimum distance error event from being written. With an EEPR4 target response, these codes increase the minimum squared distance from 24–40. However, the constraints required limit the achievable capacity to ≈0.6942—for the d=1 constraint and ≈0.8732—for the MTR constraint.

Other coding schemes have also been proposed that increase the minimum squared distance from 24–40 with the EEPR4 channel. These include the family of codes with capacities up to and above 0.8791 and the TMTR code with a capacity of 0.9032. The codes proposed here can achieve similar or higher rates to these codes due to their higher capacity, for example, a parity code of length 18 has a capacity 17/18 (=0.9444). This allows more flexibility to provide other desirable features such as short run length constraints.

In particular, by enumerating the valid code words, it can be shown that a rate 16/18 code with odd parity, a global runlength constraint of 6 consecutive identical bits, and an interleaved constraint of 8 consecutive identical bits exists.

An even higher rate code can be constructed to meet run length requirements and the parity constraint. Consider a rate 16/17(0,6/6) code which consists of freely concatenateable code words of length 17. If at the end of each pair of code words (34 bits) an additional parity bit is appended, the result is a 32/35 (0,7/7) code.

While a time varying trellis incorporating the target response and the parity constraint could be constructed, it would require twice the number of states than the target response on its own. This would require a considerably more complex detector. However, decoding may be achieved through the use of a post processor. The basic detector structure is shown in FIG. 9 and is based on a Viterbi detector matched to the channel response $G(D)=(1-D^2)(2+2D+D^2)$. The Viterbi outputs $\tilde{x}_k$ are used to reconstruct an estimate of the equalized samples $\tilde{y}_k$. This is used to calculate an estimate of the noise on the equalized samples $$\tilde{n}_k = y_k - \tilde{y}_k.$$

These noise estimates are correlated with the two likely error events to produce a noise correlation for each event at each bit time. The correlation filter is the error event convolved with the channel response all reversed in time. For example, the $a_k=\{+2,-2,+2\}$ error event requires a correlation filter response of $$H_{+2-2+2}(D) = (2 - 2D + 2D^2)G(D^{-1})$$
$$= -2D^{-4} - 2D^{-3} + 2D^{-1} - 2 + 4D^2.$$

A similar filter is used for the $a_k=\{+2,-2,+2,-2,+2\}$ event. The noise correlation values are only considered valid if the estimated bits $\tilde{x}_k$ support the error event.

At each bit time the maximum of the valid noise correlation values and the corresponding type of error event is stored. At each code word boundary, the parity constraint on the estimated bits is checked if the parity constraint is violated, the maximum valid noise correlation value over the length of the code words and across its boundaries is identified. The estimated bits $\tilde{x}_k$ corresponding to the error event associated with this maximum value are complemented under the assumption that the largest noise correlation value is the most likely position and error event to have occurred.

The use of such a postprocessor avoids increasing the complexity of the Viterbi detector, particularly when only a small number of error events need to be detected.

The proposed target and coding scheme were simulated using a software simulation based on the Lorentzian channel response with Gaussian white noise. FIG. 10 shows the required SNR for an error event rate of $10^{-6}$. The plot shows the 6221 target with the 16/18 parity code and postprocessor and the EEPR4 target with the MTR code. The plot also shows the EPR4, EEPR4, and 6221 detection systems with no coding. The coded systems perform well with 3 dB gain over EPR4 at a recording density of 3.5 bits per $PW_{50}$. The MTR coded EEPR4 system performs better than the 6221 coded system but has a lower code rate. In practice, the code rates achievable have a significant impact as the required channel SNR increases rapidly as the recording density increases.

FIG. 11 shows the simulated performance of a number of detection schemes versus user bit density. These include:

EPR4 with rate 16/17 code;
EEPR4 with rate 5/6 MTR code;
EEPR4 with rate 8/9 TMTR code;
6221 Target with rate 16/18 parity code;
6221 Target with rate 32/35 parity code.

This plot shows that the performance of the 6221 target with the rate 16/18 parity code performs better than the MTR coded EEPR4. The rate 32/35 code performs even better again providing ≈2 dB gain over the EPR4 channel at a user density of 3 bits per $PW_{50}$. The 8/9 TMTR code with EEPR4 performs at a similar level. In practice, nonlinear impairments in the recording process become significant at higher recording densities further motivating the desire to use the highest code rates possible. However, the above illustration does not take into consideration the effect of the precoder. Inserting the parity bit upstream in the data or before the precoder can cause considerable adverse effects. With any coded data there are boundaries between the blocks of data. By placing the parity bit before the precoder, this requires the parity bit to be removed after the postcoder. This causes uncorrectable problems when the parity bit is inserted between the data blocks.

SUMMARY OF THE INVENTION

The present invention inserts a parity bit into the data stream after the data stream has been precoded by a precoder circuit. Furthermore, the present invention maintains constraints on an encoded word by not breaking the constraints. More particularly, the present invention maintains D, K and I constraints. Additionally, the present invention inserts a parity bit by using feedback in the precoder. The present invention does not require the need of clock gapping on the precoder side of the parity insertion circuit. The present invention solves the uncorrectable data problem by inserting the parity bit after the precoder and correspondingly before the postcoder.

DETAILED DESCRIPTION OF THE PRESENT INVENTION

Figure 2:
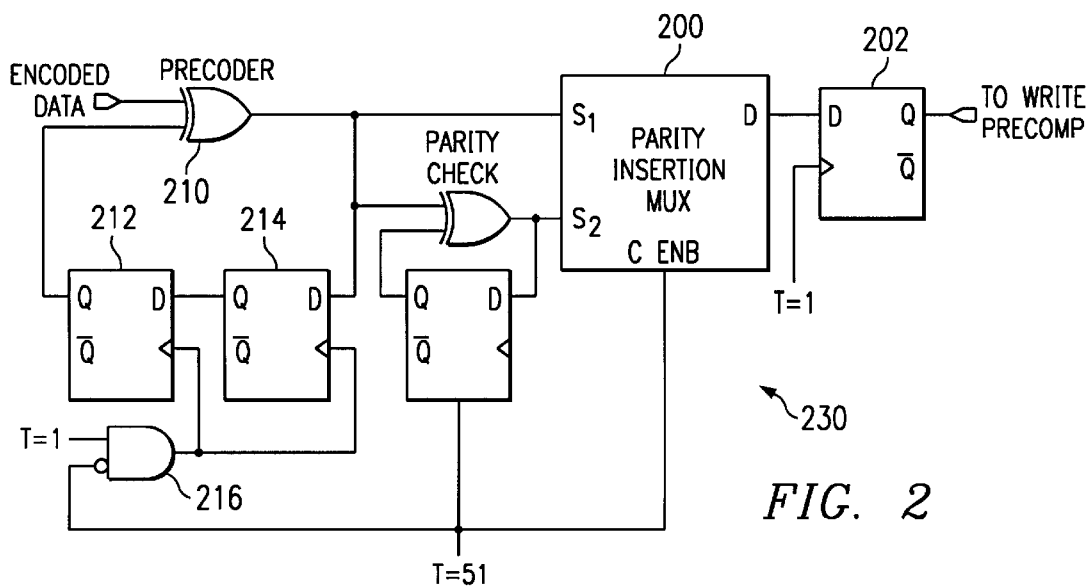
FIG. 2 illustrates a write precoder and parity insertion circuit with feedback.

FIG. 2 illustrates a write precoder circuit 101 with parity insertion without feedback. This write precoder circuit 101 is typically positioned between the data encoder circuit and the precompensation circuit and preamp. The encoded data from the encoder circuit of the read channel is input to precoder circuit 240. The precoder circuit is shown as an exclusive OR circuit The input of the precoder circuit 240 is connected to D flip-flop 212 and the output of the precoder circuit 240 is connected to the D flip-flop 214. Additionally, the output of precoder circuit 240 is connected to MUX circuit 200. The output of D flip-flop 214 is connected to D flip-flop 212. The clocking of D flip-flop 214 and D flip-flop 212 is controlled by AND gate 216. The output of precoder circuit 240 is input to exclusive OR gate 208. Additionally, input to exclusive OR circuit 208 is the output of D flip-flop 206. The output of exclusive OR gate 208 is input into D flip-flop 206. The combination of exclusive OR circuit 208 and D flip-flop 206 is a parity check circuit. The output of exclusive OR circuit 208, which is the parity bit, is input to MUX circuit 200. The output of MUX 200 is input to D flip-flop 202. The output of D flip-flop 204 is the write precompensation circuit. The MUX circuit 200 multiplexes the output of precoder circuit 240 and the parity check circuit to input a parity check bit. The function of D flip-flop 202 is to buffer and delay the output of the MUX circuit 200. The AND circuit 216 is to provide timing for the D flip-flops 212 and 214 by providing clock pulses at T=0 through T=50. At T=51, no clock pulse is provided to D flip-flops 212 and 214. This allows the encoded data to be precoded and prevents the data from the precoder circuit 240 from being input to parity check circuit 108. The output from precoder circuit 204 is delayed by D flip-flop 214. At a clock pulse, the contents of D flip-flop 214 is input to the D flip-flop 212. At the clock pulse, the output of D flip-flop 212 is input to precoder circuit 210. In such a way, the user encoded data input to the precoder circuit 240 is precoded.

Additionally, the output from the precoder circuit is input to the exclusive OR circuit 208. This input is exclusively ORed with the output from the D flip-flop 206. The D flip-flop 206 delays the output from exclusive OR circuit 208 based upon clock T=51. At T=51, the output from the exclusive OR gate 208 contains the parity bit of the input data to the precoder 240. At T=51, the MUX selects input S$_2$ which is the output from the parity circuit 208 to D flip-flop 202. At T=0 through T=50, the MUX circuit selects the input S$_1$ to output to the D flip-flop 208.

Figure 3:
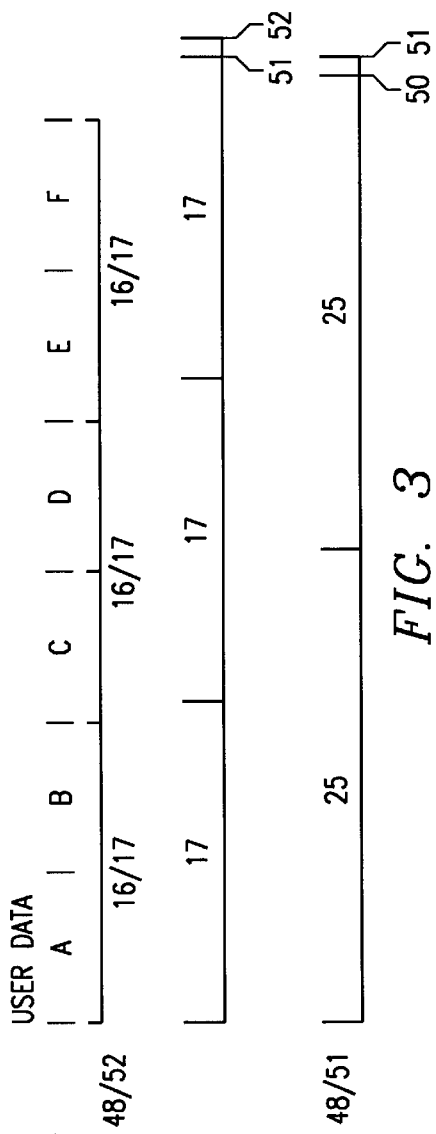
FIG. 3 illustrates a system of the present invention.

FIG. 3 illustrates a write precoder circuit with parity insertion and feedback. This circuit monitors the D, I and K constraints of the encoded data input.

Figure 1:
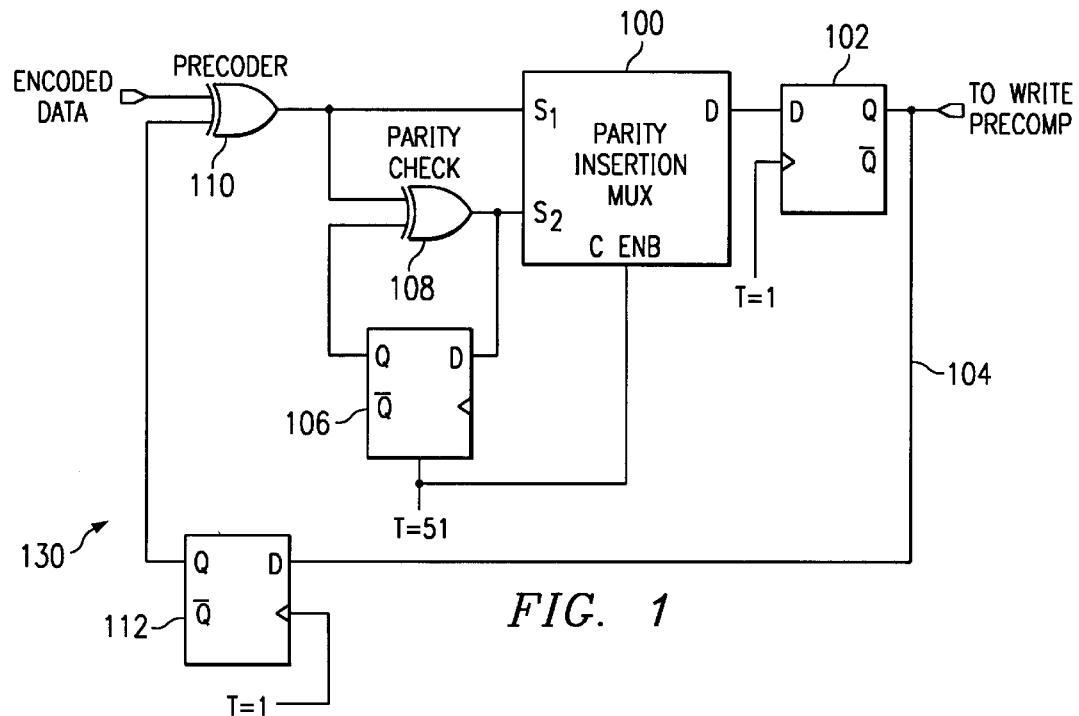
FIG. 1 illustrates a write precoder and parity insertion circuit without feedback.

Turning now to FIG. 1, a precoder receives the input data. The output of D flip-flop 112 is connected to an input of precoder circuit 110. The output of the precoder circuit 110 is connected to the parity check circuit 108. Parity check circuit 108 is shown as a XOL circuit. An output of the parity check circuit 108 is connected to an input of D flip-flop 106, and an output of the D flip-flop 106 is connected to an input of the parity check circuit 108. Additionally, the output of the parity check circuit 108 is connected to the MUX circuit 100. The output of the MUX 100 is connected to the D flip-flop 102. The output of the D flip-flop 102 includes a feedback loop to feed back from the output of D flip-flop 102 to the input to D flip-flop 112. The feedback circuit allows the clock gapping without interrupting the precoder and allows the DKI constraints on the encoded word to have nonbroken constraints. Clock gapping by the precoder circuit 110 is not required. The parity checking circuit includes parity check circuit 108 and D flip-flop 106. The D flip-flop 112 does not need clock gapping or in this specific example does not need to have the clock interrupted at T=51. The output of D flip-flop 102 is input to D flipflop 112. The D flip-flop 112 delays the output of D flip-flop 102 from input to precoder circuit 110. At every clock pulse, the contents of D flip-flop 112 is input to precoder circuit 102. The contents of flip-flop 112 is provided by flip-flop 102. This feedback allows operation of inserting a parity bit without clock gapping. Furthermore, the present invention has been described with a 16/17 code with allows 51 bits of information and a gap to be placed in the 52nd bit. The present invention could be used equally with 24/25 code which allows 50 bytes of information plus a gap to be placed in the 51st bit of information.

Figure 4:
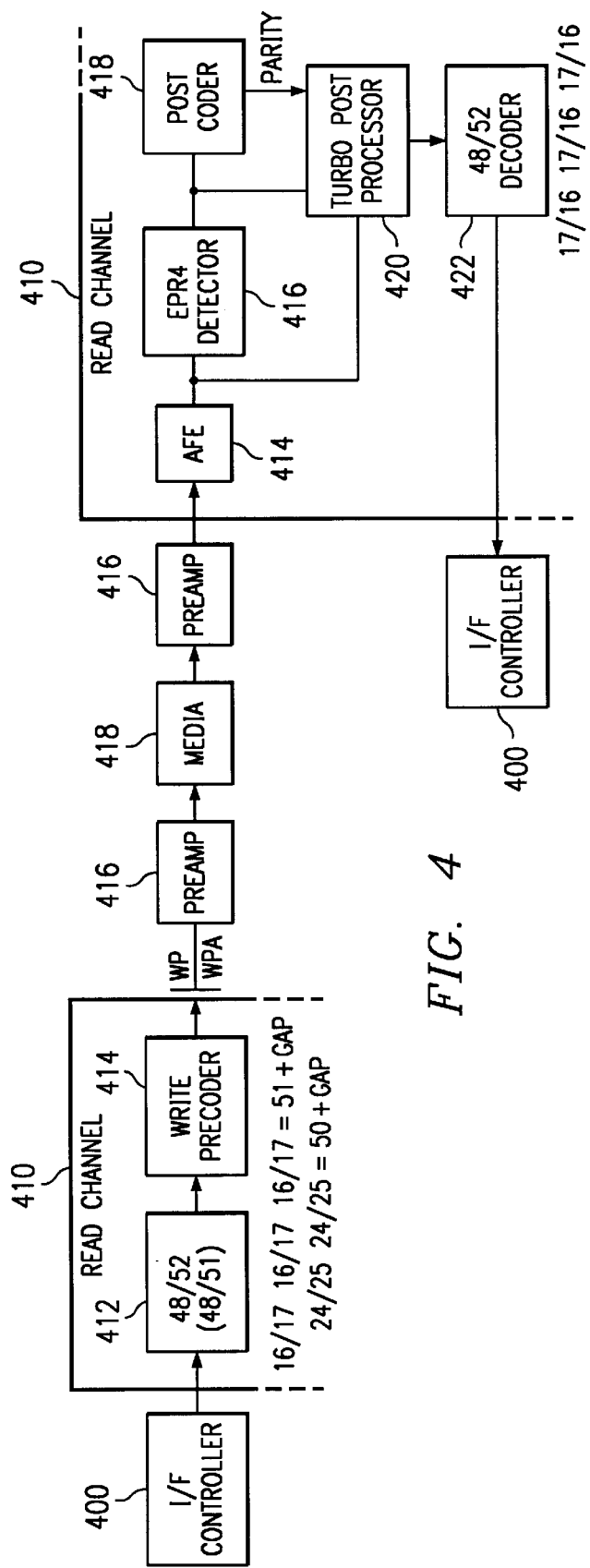
FIG. 4 illustrates an example of parity insertion.
Figure 5:
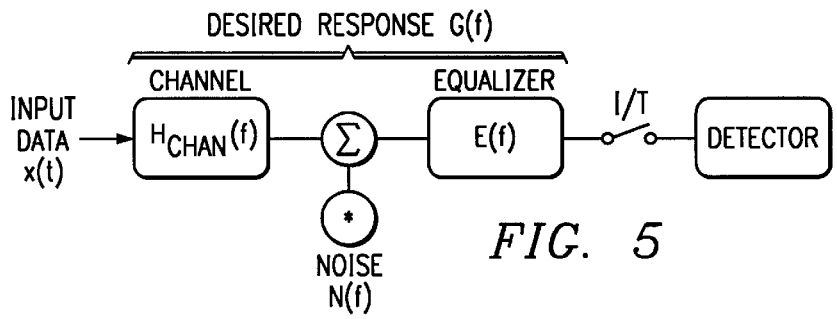
FIG. 5 illustrates a detection system model.
Figure 6:
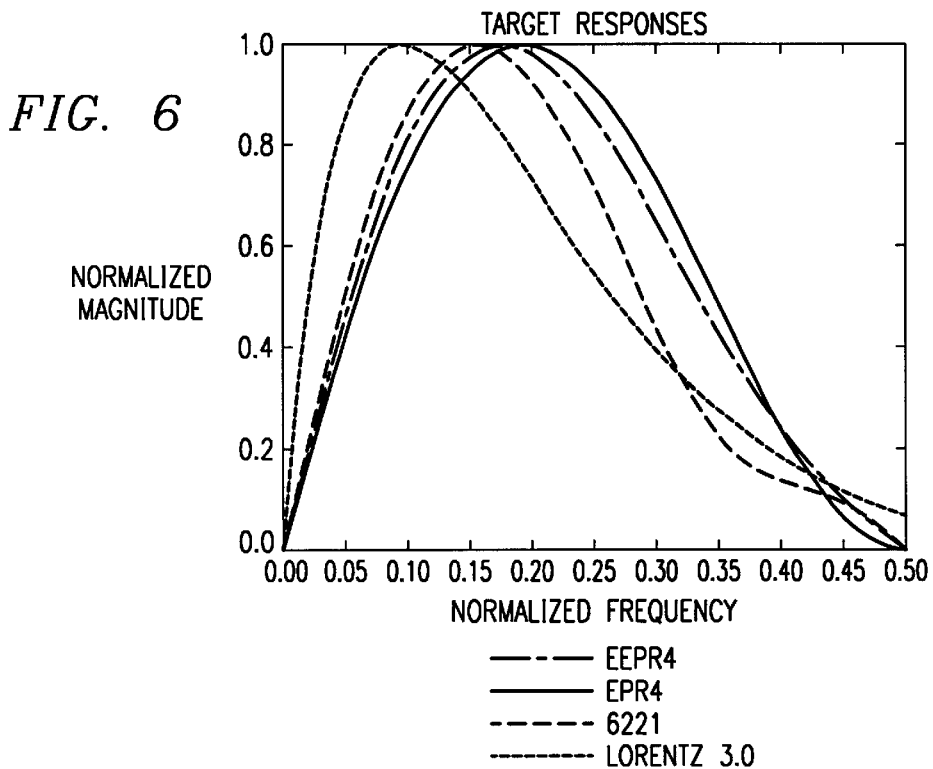
FIG. 6 illustrates target response.
Figure 9:
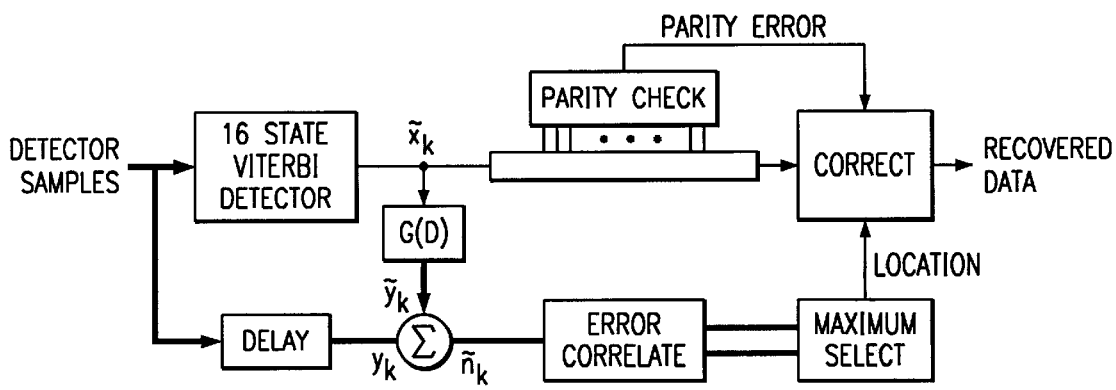
FIG. 9 illustrates detector structure.
Figure 7:
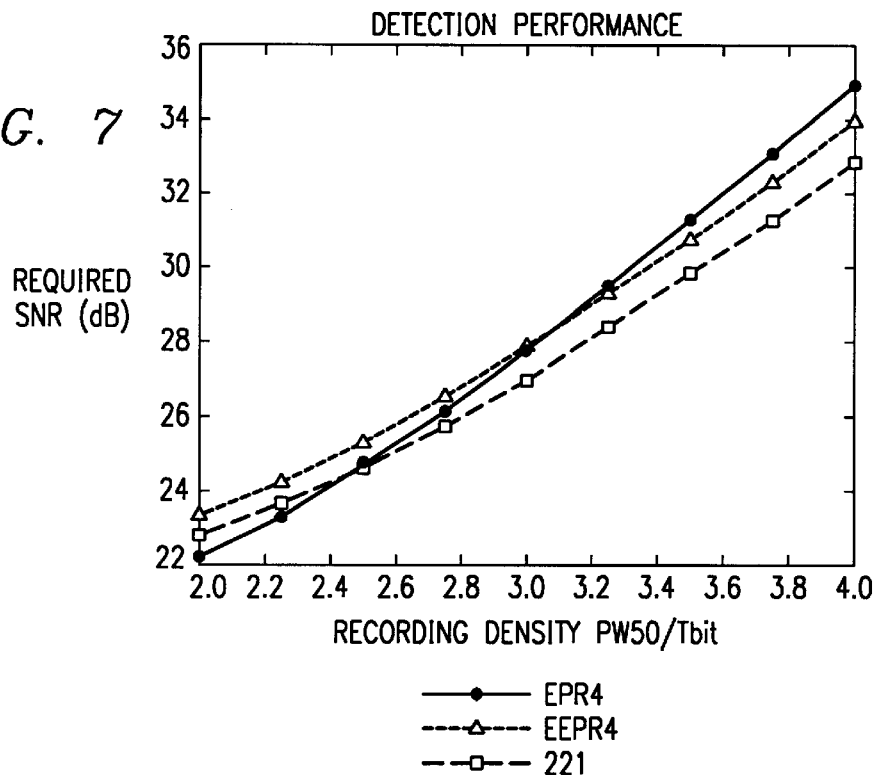
FIG. 7 illustrates detection performance.
Figure 8:
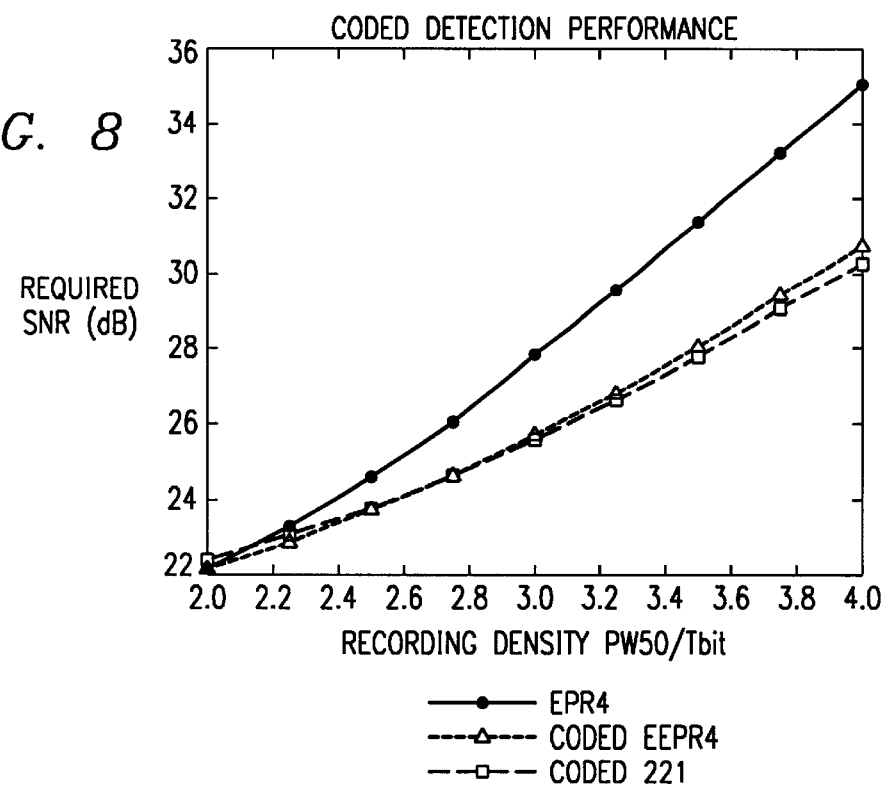
FIG. 8 illustrates coded detection performance.
Figure 10:
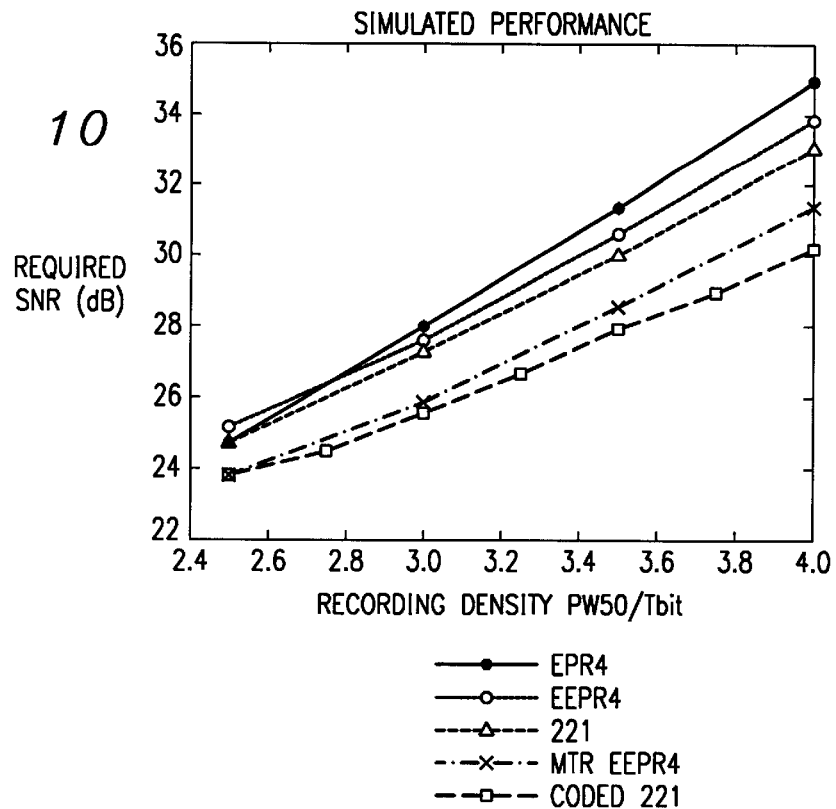
FIG. 10 illustrates simulated performance.
Figure 11:
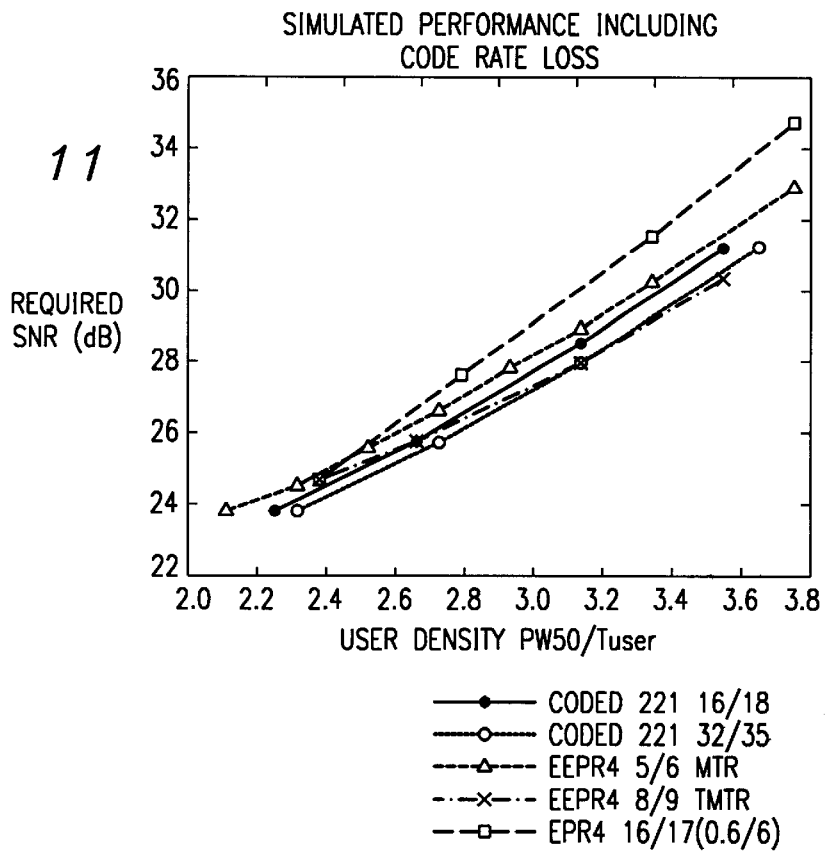
FIG. 11 illustrates simulated performance including code rate loss.

FIG. 4 illustrates a system diagram of the present invention. An I/F controller 400 sends user data to the read channel 410. The read channel includes an encoder 412. The encoder 412 outputs encoded information to a write precoder 414 which outputs data to the preamp 416. The write precoder 414 includes the write precoder and parity insertion circuit 130 with feedback or the write precoder and parity insertion circuit 230 without feedback. The output of the preamp is written to a medium. The data output from the write precoder circuit is an encoded stream of bit, for example, a 48/52 code with a parity bit. During a read cycle, the data is read from the medium and input to a preamp 416. The preamp 416 inputs data to the read channel 410. The read channel includes an AFE circuit 414 which outputs to an EPR4 detector 416. The EPR4 detector detects the code outputs to a post decoder 418 which detects or decodes a parity bit. The output of the AFE and the EPR4 detector and the postcoder is input to a turbo processor 420 which outputs the information to a 48/52 decoder 422. The output of the 48/52 decoder is input to an I/F controller 400.

FIG. 3 shows user data with a 16/17 code, three groups of 17 bits combined to form 51 bits, leaving the 52nd bit free for a parity bit. Likewise, with a 24/25 code, two groups of 25 data form 50 bits, leaving a 51st bit for a parity bit.

What is claimed is:

1. A circuit for inserting a parity signal into a data stream, comprising:

a precoder circuit to precode the data stream to be written on a medium by generating a precoded data stream;

a parity circuit to generate a parity signal based on said precoded data stream at a predetermined time; and an insertion circuit to insert said parity signal into said precoded data stream, wherein said precoder circuit includes a feedback circuit based on the output of said insertion circuit.

2. A circuit for inserting a parity signal into a data stream, as in claim 1, wherein said parity signal is inserted following said precoded data stream.

3. A circuit for inserting a parity signal into a data stream, as in claim 1, wherein said precoder circuit is clocked at every clock pulse.

4. A circuit for inserting a parity signal into a data stream, as in claim 1, wherein said parity circuit is clocked only at said predetermined time.

5. A circuit for inserting a parity signal into a data stream, as in claim 1, wherein said precoder circuit is not clocked at said predetermined time.

* * * * *